(12) United States Patent
Yuan et al.

(10) Patent No.: US 9,041,087 B2
(45) Date of Patent: May 26, 2015

(54) SEMICONDUCTOR DEVICES HAVING DIELECTRIC CAPS ON CONTACTS AND RELATED FABRICATION METHODS

(71) Applicant: GLOBALFOUNDRIES Inc., Grand Cayman (KY)

(72) Inventors: Lei Yuan, Sunnyvale, CA (US); Jin Cho, Palo Alto, CA (US); Jongwook Kye, Pleasanton, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/288,034

(22) Filed: May 27, 2014

(65) Prior Publication Data

US 2014/0264499 A1   Sep. 18, 2014

Related U.S. Application Data

(62) Division of application No. 13/345,388, filed on Jan. 6, 2012, now Pat. No. 8,765,599.

(51) Int. Cl.
| | |
|---|---|
| *H01L 29/66* | (2006.01) |
| *H01L 23/48* | (2006.01) |
| *H01L 21/4763* | (2006.01) |
| *H01L 29/423* | (2006.01) |
| *H01L 23/485* | (2006.01) |
| *H01L 21/8234* | (2006.01) |

(Continued)

(52) U.S. Cl.
CPC .......... *H01L 29/4232* (2013.01); *H01L 23/485* (2013.01); *H01L 21/823425* (2013.01); *H01L 21/823475* (2013.01); *H01L 21/76888* (2013.01); *H01L 21/76895* (2013.01); *H01L 21/76897* (2013.01); *H01L 21/76834* (2013.01); *H01L 29/66477* (2013.01); *H01L 29/78* (2013.01); *H01L 2924/0002* (2013.01)

(58) Field of Classification Search
CPC .. H01L 27/088; H01L 27/10873; H01L 29/78
See application file for complete search history.

(56) References Cited

U.S. PATENT DOCUMENTS

| | | | |
|---|---|---|---|
| 6,534,389 B1 * | 3/2003 | Ference et al. ................ | 438/586 |
| 6,642,144 B2 | 11/2003 | Han et al. | |
| 2002/0192911 A1 | 12/2002 | Parke | |

(Continued)

FOREIGN PATENT DOCUMENTS

CN          101621030 A        1/2010

OTHER PUBLICATIONS

U.S. Appl. No. 12/968,068, filed Dec. 14, 2010.
U.S. Appl. No. 13/014,561, filed Jan. 26, 2011.

(Continued)

*Primary Examiner* — Brett Feeney
*Assistant Examiner* — Pamela E Perkins
(74) *Attorney, Agent, or Firm* — Ingrassia Fisher & Lorenz, P.C.

(57) ABSTRACT

Semiconductor device structures are provided. An exemplary semiconductor device structure includes a substrate of a semiconductor material and a gate structure overlying the substrate. The semiconductor substrate further includes a doped region formed in the substrate proximate the gate structure and a first dielectric material overlying the doped region. The semiconductor substrate also includes a conductive contact formed in the first dielectric material, the conductive contact being electrically connected to the doped region, and a dielectric cap overlying the conductive contact.

20 Claims, 15 Drawing Sheets

(51) Int. Cl.
*H01L 21/768* (2006.01)
*H01L 29/78* (2006.01)

(56) References Cited

U.S. PATENT DOCUMENTS

| | | |
|---|---|---|
| 2005/0277258 A1 | 12/2005 | Huang et al. |
| 2007/0099414 A1 | 5/2007 | Frohberg et al. |
| 2008/0012019 A1 | 1/2008 | Zhu et al. |
| 2010/0210083 A1 | 8/2010 | Fukuda et al. |

OTHER PUBLICATIONS

Packan, P. et al. "High Performance 32nm Logic Technology Featuring 2nd Generation High-k + Metal Gate Transistor," Electron Devices Meeting (IEDM), 2009 IEEE International; Dec. 7-9, 2009. pp. 28.4.1-28.4.4.

State Intellectual Property Office of the Peoples' Republic of China, Office Action for Chinese Patent Application No. 201310003751.4, mailed Jul. 25, 2014.

Intellectual Property Office, Examination Report for Taiwanese Patent Application No. 101126431 mailed Jan. 27, 2015.

* cited by examiner

US 9,041,087 B2

SEMICONDUCTOR DEVICES HAVING DIELECTRIC CAPS ON CONTACTS AND RELATED FABRICATION METHODS

CROSS-REFERENCE TO RELATED APPLICATIONS

This is a divisional of U.S. application Ser. No. 13/345,388, filed Jan. 6, 2012.

TECHNICAL FIELD

Embodiments of the subject matter generally relate to semiconductor devices and to device fabrication methods, and more particularly, relate to devices and to fabrication methods for forming contacts between devices formed on a semiconductor substrate and overlying layers.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry. As the size and spacing of the transistors decrease, it is more difficult to avoid inadvertent creation of electrical connections between adjacent devices, which, in turn, reduces yield.

BRIEF SUMMARY

A method is provided for fabricating a semiconductor device structure. The semiconductor device includes a gate structure overlying a semiconductor substrate and a doped region formed in the semiconductor substrate adjacent to the gate structure. The method involves forming a first layer of a first dielectric material overlying the doped region, forming a first conductive contact electrically connected to the doped region within the first layer, forming a dielectric cap on the first conductive contact, forming a second layer of a second dielectric material overlying the dielectric cap and the gate structure, and forming a second conductive contact electrically connected to the gate structure within the second layer.

In another embodiment, a method of fabricating a semiconductor device structure involves forming a first layer of a first dielectric material overlying a doped region formed in a semiconductor substrate, removing portions of the first layer to form a first voided region overlying the doped region, forming a first conductive contact electrically connected to the doped region in the first voided region, forming a dielectric cap on the first conductive contact, forming a second layer of a second dielectric material overlying the dielectric cap and a gate structure formed on the semiconductor substrate, removing portions of the second layer overlying the gate structure to form a second voided region exposing the gate structure while leaving the dielectric cap intact, and forming a second conductive contact electrically connected to the gate structure in the second voided region.

In yet another embodiment, an apparatus for a semiconductor device is provided. The semiconductor device structure includes a substrate of a semiconductor material, a gate structure overlying the substrate, a doped region formed in the substrate proximate the gate structure, a first dielectric material overlying the doped region, a first conductive contact electrically connected to the doped region formed in the first dielectric material, and a dielectric cap overlying the first conductive contact.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-10 illustrate a semiconductor device structure 100 and related process steps for fabricating the semiconductor device structure 100 with conductive electrical contacts to doped source/drain regions formed in a semiconductor substrate. Although the subject matter may be described herein in the context of a MOS semiconductor device, the subject matter is not intended to be limited to MOS semiconductor devices, and may be utilized with other semiconductor devices which are not MOS semiconductor devices. Additionally, although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of MOS semiconductor devices are well known and so, in the interest of brevity, many conventional steps will only be mentioned briefly herein or will be omitted entirely without providing the well known process details.

Figure 1:
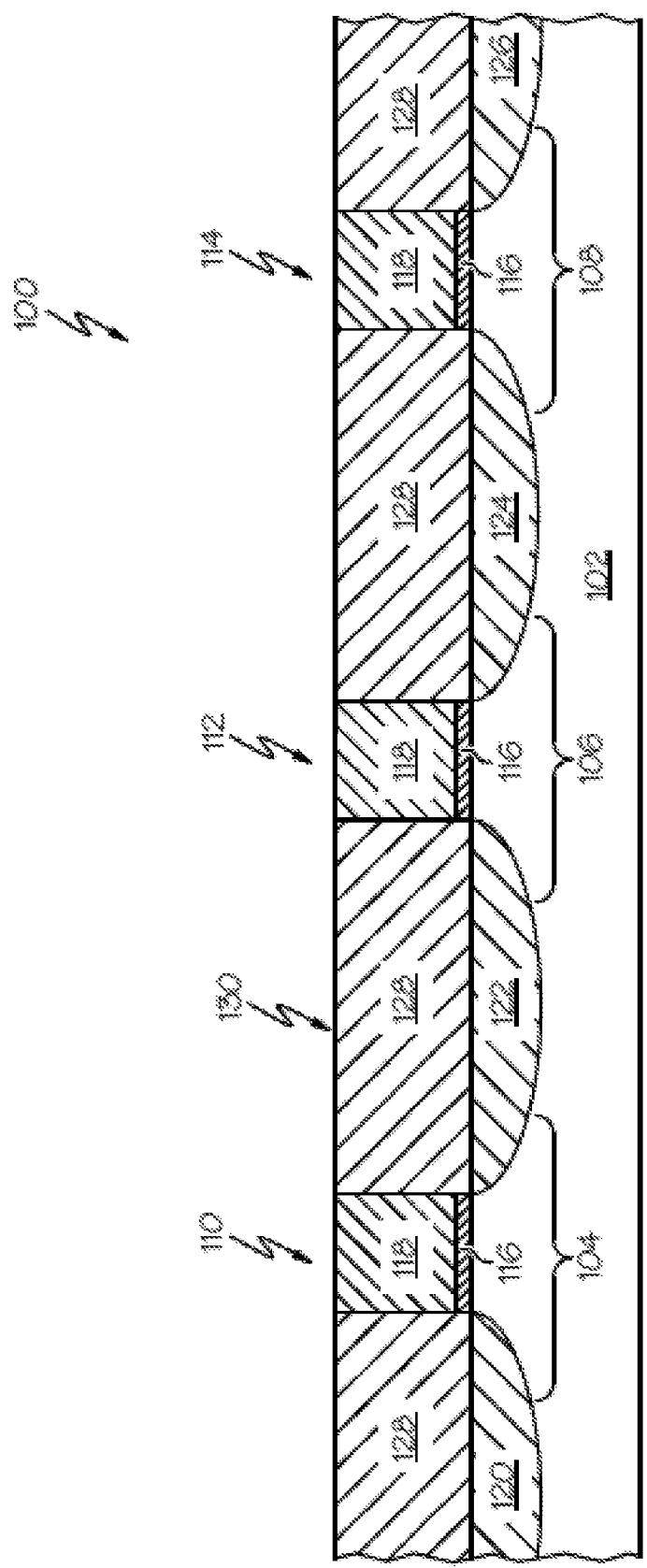
FIGS. 1-10 are cross-sectional views that illustrate a semiconductor device structure and methods for fabricating the semiconductor device structure in accordance with one or more embodiments.

Referring now to FIG. 1, the fabrication process begins after front end of line (FEOL) processing steps are performed to fabricate a semiconductor device structure 100 that includes a plurality of transistor structures 104, 106, 108 formed on a substrate of a semiconductive material 102, such as monocrystalline silicon or another silicon-comprising material, in a conventional manner. In an exemplary embodiment, the semiconductor material 102 is doped in a conventional manner to achieve a desired dopant profile for the body regions (or well regions) of the transistor structures 104, 106, 108.

As illustrated in FIG. 1, each transistor structure 104, 106, 108 includes a gate structure 110, 112, 114 overlying the semiconductor substrate 102 that functions as a gate electrode for the respective transistor structure 104, 106, 108. The gate structures 110, 112, 114 can be created using a conventional gate stack module or any combination of well-known process steps. In practice, each gate structure 110, 112, 114 typically includes at least one layer of dielectric material 116 (e.g., an oxide material, high-k dielectric material, or the like) overlying the semiconductor substrate 102, and at least one layer of conductive material 118 (e.g., a metal material, a polysilicon material, or the like) overlying the dielectric material 116. It should be understood that various numbers, combinations and/or arrangements of materials may be utilized for the gate structures in a practical embodiment, and the subject matter described herein is not limited to any particular number, combination, or arrangement of gate material(s) in the gate structure. Additionally, the subject matter is not intended to be limited to any particular number of gate structures.

Each transistor structure 104, 106, 108 also includes spaced-apart doped regions 120, 122, 124, 126 formed in the semiconductor substrate 102 adjacent to its respective gate structure 110, 112, 114 that function as source/drain regions for the respective transistor structures 104, 106, 108. Accordingly, for convenience, but without limitation, the doped regions 120, 122, 124, 126 are alternately referred to herein as source/drain regions. For example, P-type source/drain regions for PMOS transistor structures may be formed by implanting P-type ions into the semiconductor material 102 using the gate structures 110, 112, 114 as an implantation mask, or alternatively, N-type source/drain regions for NMOS transistor structures may be formed by implanting N-type ions into the semiconductor material 102 using the gate structures 110, 112, 114 as an implantation mask.

It will be appreciated that although FIG. 1 depicts the source/drain regions as being integrally formed with or otherwise contiguous with source/drain regions of adjacent transistor structures for purposes of illustration, the subject matter is not intended to be limited to any particular arrangement of the source/drain regions. For example, in practice, the transistor structures may be electrically isolated (e.g., by performing shallow trench isolation (STI) or another isolation process) and independently doped in a conventional manner.

Still referring to FIG. 1, in an exemplary embodiment, the fabrication process continues by forming a dielectric material 128 between neighboring gate structures 110, 112, 114 and overlying the doped regions 120, 122, 124, 126. In an exemplary embodiment, the dielectric material 128 is formed by conformably depositing a layer of the dielectric material 128, such as silicon dioxide or another oxide material, overlying the gate structures 110, 112, 114 and the doped regions 120, 122, 124, 126 by chemical vapor deposition (CVD) or another deposition process. The thickness of the layer of dielectric material 128 is chosen such that the dielectric material 128 completely fills any gaps between the gate structures 110, 112, 114 to a minimum height that meets or exceeds the height of the gate structures 110, 112, 114, or in other words, the thickness of the dielectric material 128 is greater than or equal to the height of the gate structures 110, 112, 114.

After forming the layer of dielectric material 128, the fabrication process continues by removing portions of the dielectric material 128 overlying the gate structures 110, 112, 114 to obtain a substantially planar surface 130 that is aligned with the upper surface of the gate structures 110, 112, 114, resulting in the device structure 100 illustrated by FIG. 1. In an exemplary embodiment, the fabrication process planarizes the layer of dielectric material 128 to uniformly remove portions of the dielectric material 128 across the semiconductor substrate until reaching the conductive gate material 118 of the gate structures 110, 112, 114. In other words, the fabrication process ceases planarizing the dielectric material 128 when the upper surfaces of the gate structures 110, 112, 114 are exposed. In accordance with one embodiment, chemical-mechanical planarization (CMP) is used to polish the dielectric material 128 with a chemical slurry for a predetermined amount of time based on the thicknesses of the dielectric material 128 such that the CMP stops when the upper surfaces of the gate structures 110, 112, 114 are exposed. Alternative endpoint detection techniques could also be utilized to determine when to stop the CMP procedure, or alternative planarization techniques may be used to obtain the substantially planar surface 130 that is aligned with the upper surfaces of the gate structures 110, 112, 114.

Figure 2:
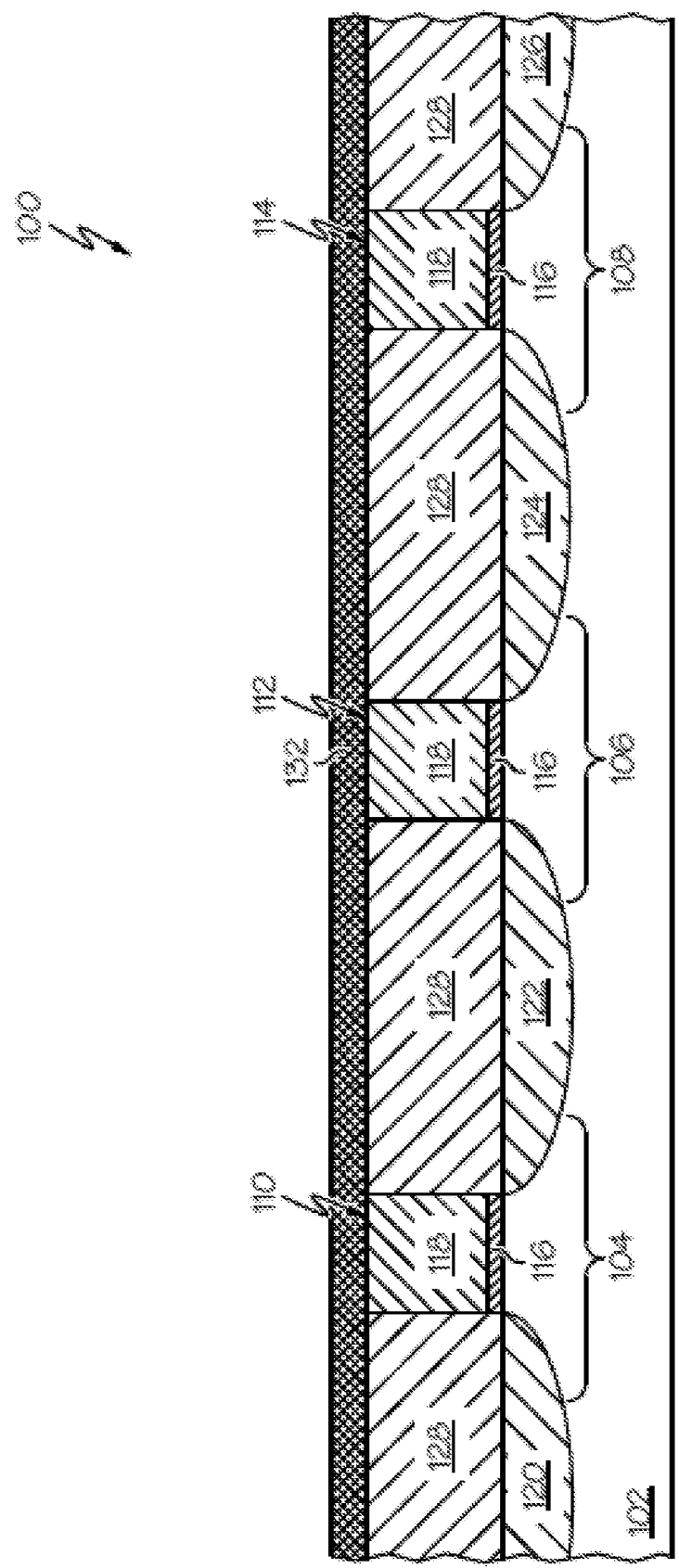

Turning now to FIG. 2, in an exemplary embodiment, after forming the dielectric material 128 between the gate structures 110, 112, 114, the fabrication process continues by forming a layer of dielectric material 132 overlying the gate structures 110, 112, 114 and the dielectric material 128. In an exemplary embodiment, the dielectric material 132 is realized as a hard mask material, such as silicon nitride or the like, that is conformably deposited overlying the planar surface 130 of the semiconductor device structure 100 of FIG. 1. For convenience, but without limitation, the dielectric material 132 is alternatively referred to herein as a hard mask material. As described in greater detail below in the context of FIGS. 11-14, in accordance with one or more embodiments, prior to forming the hard mask material 132, a dielectric gate capping material is formed on the conductive gate material 118. For example, the dielectric gate capping material may be realized as an oxide material formed by oxidizing the conductive gate material 118 (e.g., by thermal oxidation or chemical oxidation).

Figure 3:
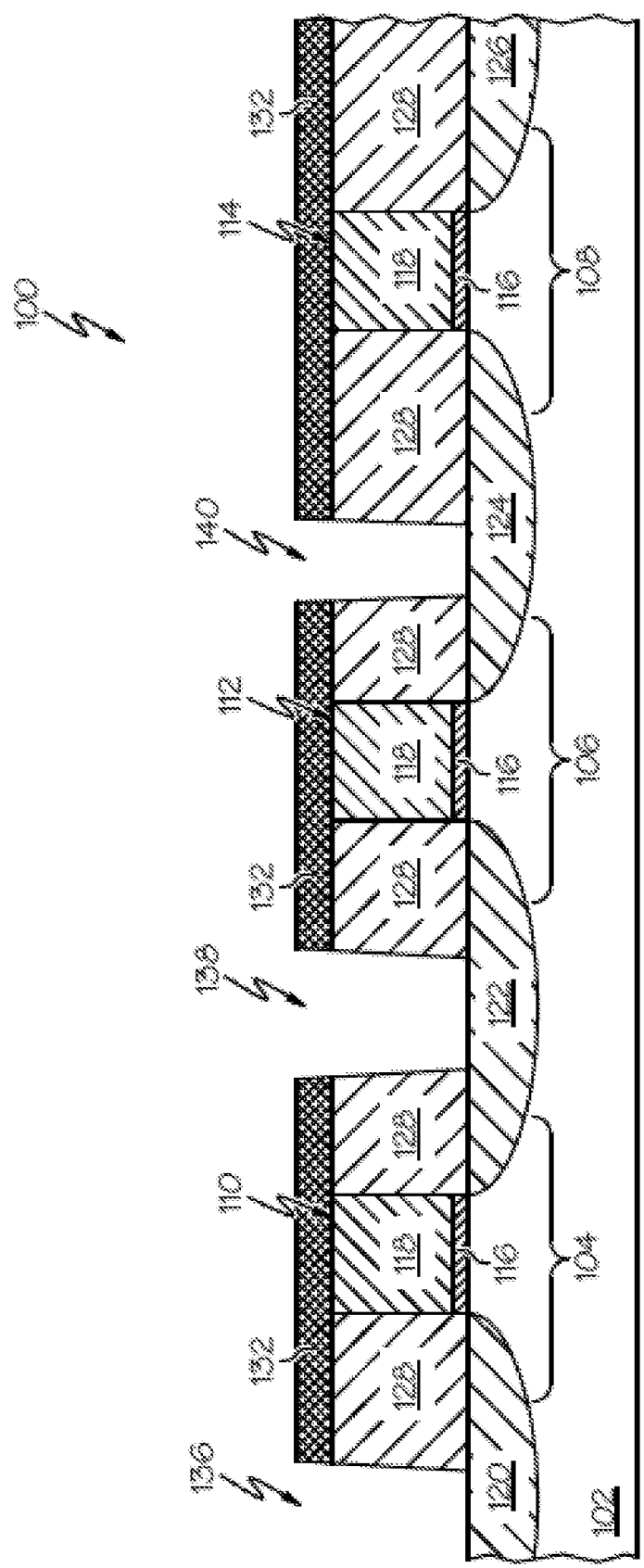
Figure 4:
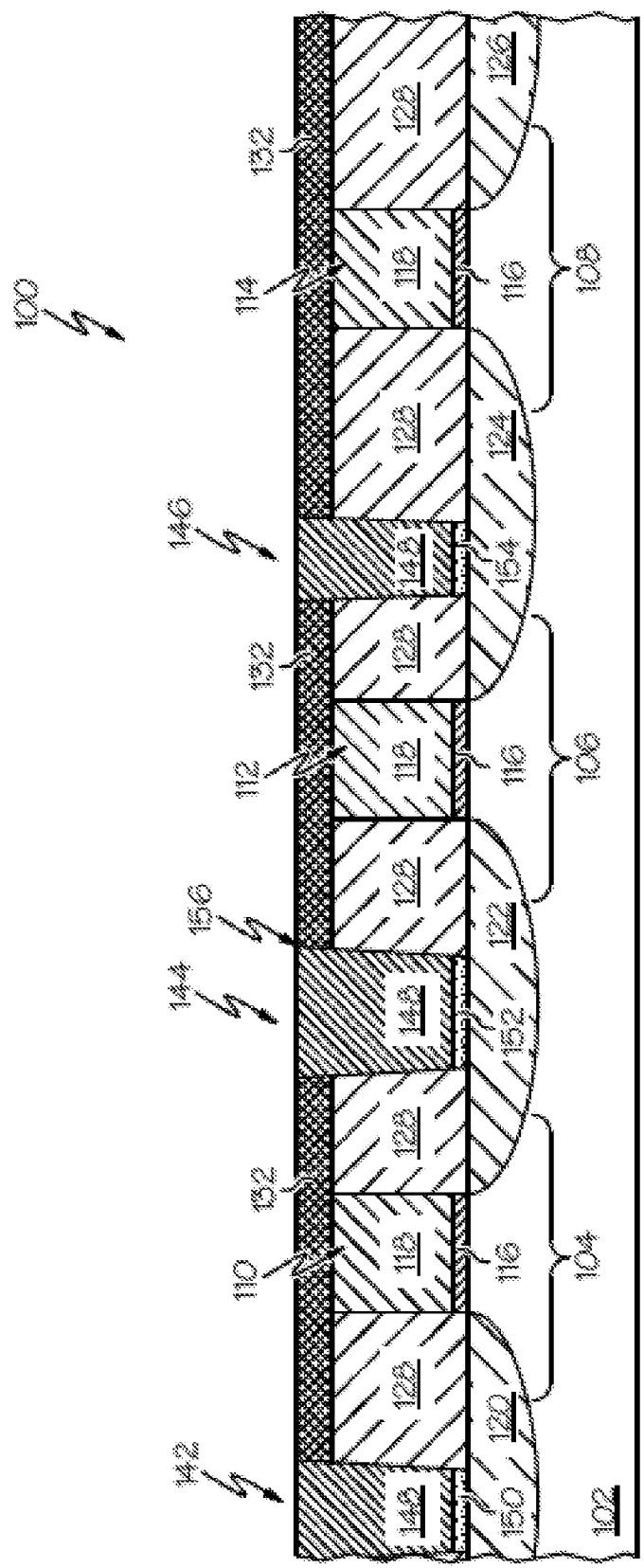

Turning now to FIGS. 3-4, after forming the hard mask material 132, the fabrication process continues by selectively removing portions of the dielectric material 128 and hard mask material 132 overlying the source/drain regions 120, 122, 124, 126 to create voided regions 136, 138, 140 overlying the source/drain regions 120, 122, 124, 126 and forming conductive contacts 142, 144, 146 in the voided regions 136, 138, 140. The source/drain contacts 142, 144, 146 are realized as a conductive material 148 that provides an electrical connection to source/drain regions 120, 122, 124, 126, wherein the voided regions 136, 138, 140 define the lateral dimensions of the source/drain contacts 142, 144, 146 subsequently formed therein. In some embodiments, the voided regions 136, 138, 140 also correspond to the pattern, routing and/or intralayer interconnections to be provided by the source/drain contacts 142, 144, 146. In this regard, in addition to providing vertical interconnections to overlying contact layers and/or metal layers, the source/drain contacts 142, 144, 146 may also provide lateral intralayer interconnections (alternatively referred to as local interconnects) between source/drain regions of different transistor structures. For convenience, but without limitation, the source/drain contacts 142, 144, 146 may alternatively be referred to herein as lower level source/drain contacts.

Referring to FIG. 3, in an exemplary embodiment, the fabrication process forms a layer of masking material, such as a photoresist material, overlying the semiconductor device structure 100 of FIG. 2 and removes portions of the masking material (e.g., using photolithography or a suitable etchant chemistry) to create an etch mask that defines the pattern for the conductive material 148 of the lower level source/drain contacts 142, 144, 146. In this regard, portions of the hard mask material 132 overlying the source/drain regions 120, 122, 124, 126 that will subsequently be removed to create the voided regions 136, 138, 140 are exposed by the etch mask. The portions of the dielectric material 128 adjacent to the gate structures 110, 112, 114 are protected by the masking material to electrically isolate the subsequently formed contacts 142, 144, 146 from adjacent gate structures 110, 112, 114. After patterning the masking material, the fabrication process continues by selectively removing exposed portions of the dielectric materials 128, 132 using the patterned masking material as an etch mask. In an exemplary embodiment, the exposed portions of dielectric materials 128, 132 are removed using an anisotropic (or directional) etch process that stops on the semiconductor material 102, for example, by plasma-based reactive ion etching (RIE) using an anisotropic etchant chemistry. After removing exposed portions of the dielectric materials 128, 132 to form the voided regions 136, 138, 140, the fabrication process continues by removing any remaining masking material in a conventional manner to obtain the semiconductor device structure 100 illustrated in FIG. 3.

Referring to FIG. 4, after creating voided regions 136, 138, 140, the fabrication process continues by forming contacts 142, 144, 146 in the voided regions 136, 138, 140. In the illustrated embodiment, prior to forming the conductive material 148, metal silicide contact regions 150, 152, 154 are formed on the exposed upper surfaces of the source/drain regions 120, 122, 124 in a conventional manner to facilitate forming electrical connections to the source/drain regions 120, 122, 124. After forming the silicide contact regions 150, 152, 152, the lower level source/drain contacts 142, 144, 146 are preferably formed by conformably depositing a layer of conductive material 148, such as a tungsten material, by CVD or another deposition process to a thickness chosen such that the conductive material 148 fills the voided regions 136, 138, 140 to a minimum height that meets or exceeds the height of the gate structures 110, 112, 114 combined with the thickness of the hard mask material 132 (e.g., a "flush" fill or overfill). As illustrated, the conductive material 148 completely fills the voided regions 136, 138, 140 and contacts the contact regions 150, 152, 154 to provide a conductive electrical connection to the source/drain regions 120, 122, 124, 126. Although not illustrated, it should be noted that in some embodiments, a relatively thin layer of a barrier material may be formed in the voided regions 136, 138, 140 prior to forming the layer of conductive material 148.

After forming the layer of conductive material 148, the fabrication process continues by planarizing the semiconductor device structure 100 to remove portions of the conductive material 148 overlying the hard mask material 132 to obtain a substantially planar surface 156 that is aligned with the upper surface of the hard mask material 132, resulting in the semiconductor device structure 100 of FIG. 4. In this regard, the conductive material 148 is uniformly removed across the semiconductor device structure 100 until reaching hard mask material 132, for example, by performing CMP to polish the conductive material 148 with a chemical slurry and stopping when the upper surfaces of the hard mask material 132 are exposed, in a similar manner as described above.

Figure 5:
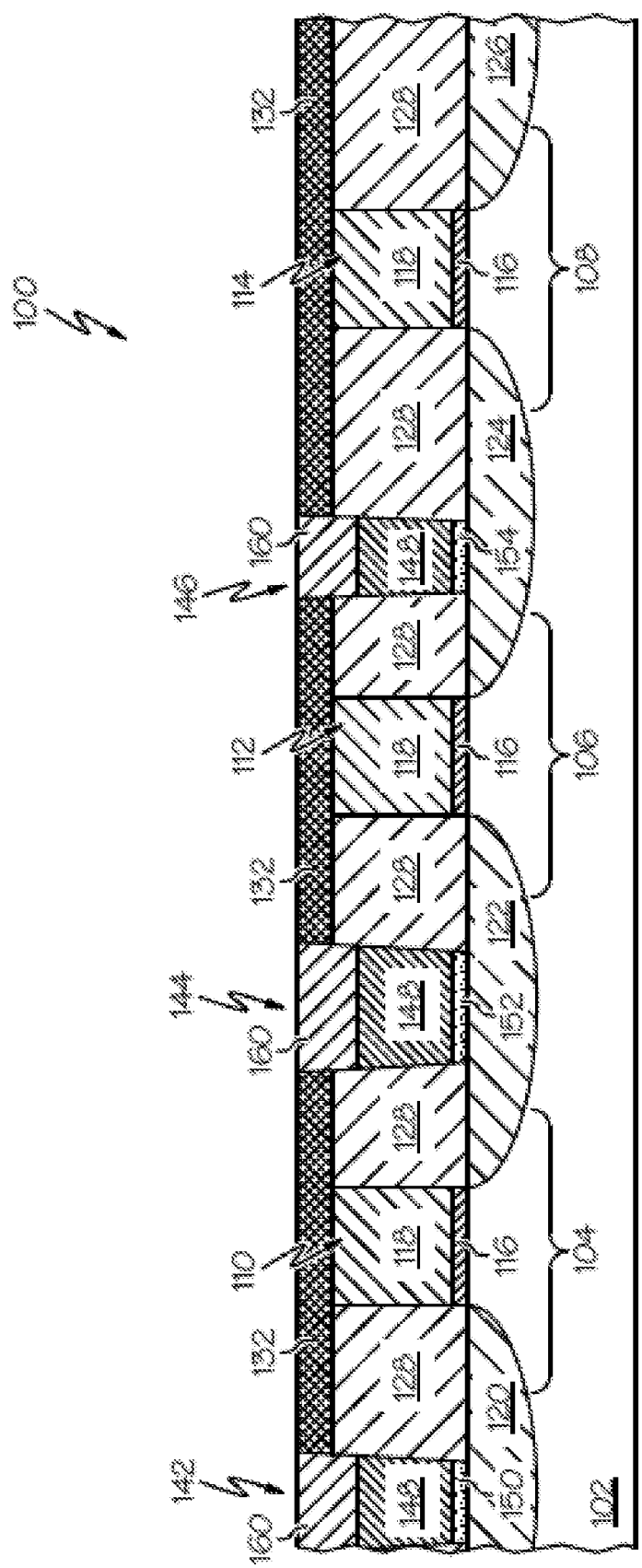

Turning now to FIG. 5, in the illustrated embodiment, the fabrication process continues by forming dielectric caps on the lower level source/drain contacts 142, 144, 146. In accordance with one embodiment, a dielectric capping material 160 is formed on the lower level source/drain contacts 142, 144, 146 by oxidizing the exposed surfaces of the conductive material 148 (e.g., by thermal oxidation or chemical oxidation) to form the oxide capping material 160 from the upper surface of the lower level source/drain contacts 142, 144, 146. In this regard, oxidizing the conductive material 148 to grow the oxide capping material 160 on the exposed surfaces of the conductive material 148 consumes the exposed conductive material 148, such that the upper surfaces of the oxide capping material 160 are maintained substantially aligned with the upper surfaces of the remaining hard mask material 132 overlying the gate structures 110, 112, 114 after the oxide capping material 160 is grown. In an exemplary embodiment, the oxide capping material 160 is grown to a thickness that is greater than or equal to the thickness of the hard mask material 132 so the underlying conductive material 148 is not inadvertently exposed during subsequent etch process steps, as described in greater detail below. In other words, after oxidation, the upper surface of the conductive material 148 (e.g., the interface with the oxide capping material 160) is below the upper surface of the conductive gate material 118. It should be noted that in alternative embodiments, if the oxidation rate of the conductive material 148 is not sufficient (or too low) to result in the upper surface of the conductive material 148 being below the upper surface of the conductive gate material 118, the conductive material 148 may be deposited to a thickness that is less than the height of the conductive gate material 118, and a second conductive material having a greater oxidation rate may be deposited overlying the conductive material 148 prior to the planarization step, wherein the second conductive material is then oxidized to provide the oxide capping material 160 with a thickness that is greater than or equal to the thickness of the hard mask material 132.

Still referring to FIG. 5, in accordance with one or more alternative embodiments, the dielectric capping material 160 is realized as a hard mask material or another dielectric material formed on the lower level source/drain contacts 142, 144, 146, for example, if oxide material formed by oxidizing the conductive material 148 does not provide the desired amount of isolation and/or the desired amount of etch selectivity for subsequent process steps. In this regard, after planarizing and oxidizing the conductive material 148, oxide material overlying the conductive material 148 is removed using an anisotropic etchant chemistry that is selective to oxide material without attacking the hard mask material 132, such that the hard mask material 132 overlying the gate structure 110 remains intact while at least some of (if not all of) the oxide material is removed from the conductive material 148. After removing oxide material from the conductive material 148, the dielectric caps are formed by conformably depositing the dielectric capping material 160, such as a hard mask material or another suitable dielectric material, overlying the hard mask material 132 and the conductive material 148 to a thickness that is greater than the difference between the upper surfaces of the hard mask material 132 and the upper surfaces of the conductive material 148 to fill any voided regions above the conductive material 148 to a minimum height that meets or exceeds the hard mask material 132 on top of the gate structures 110, 112, 114. After forming the layer of dielectric capping material 160, the dielectric capping material 160 is planarized to obtain a substantially planar surface resulting in the semiconductor device structure 100 of FIG. 5. Preferably, the dielectric capping material 160 is different from the hard mask material 132 to allow the hard mask material 132 to be selectively etched while the dielectric capping material 160 remains intact, and vice versa, as described in greater detail below.

Figure 6:
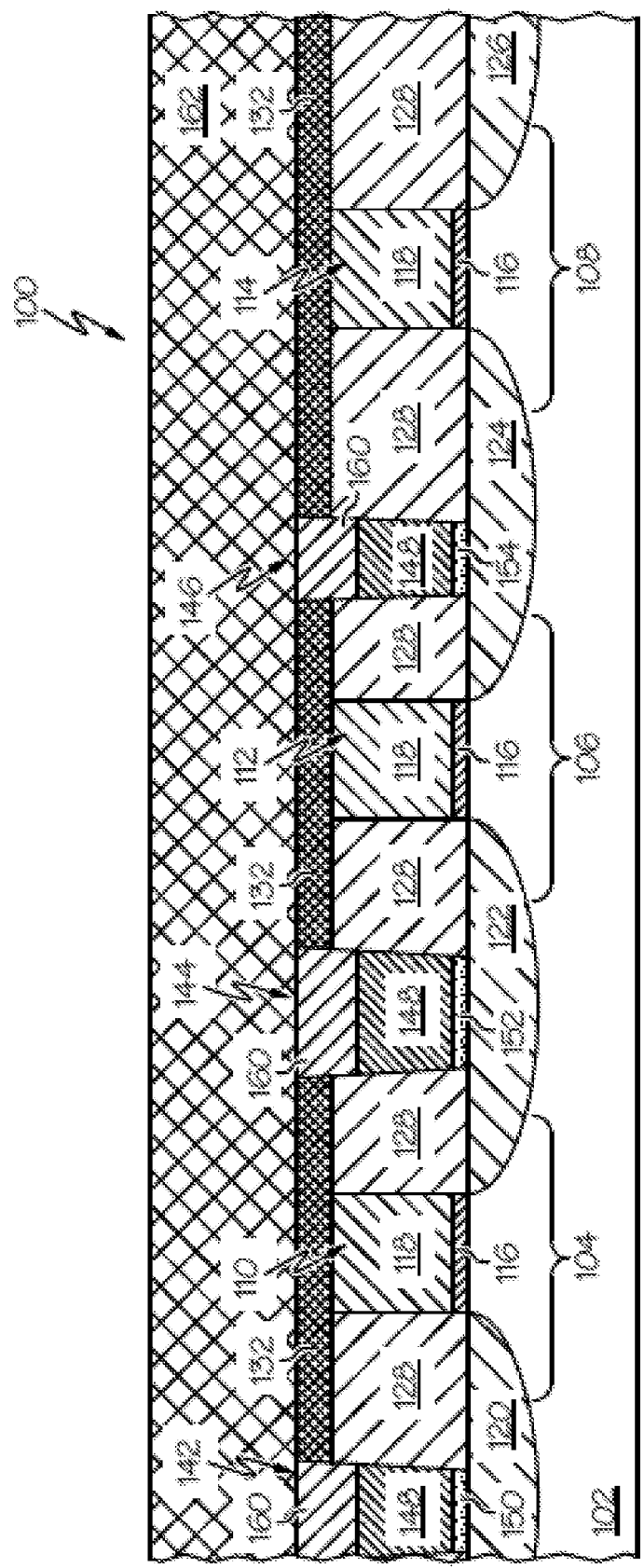
Figure 7:
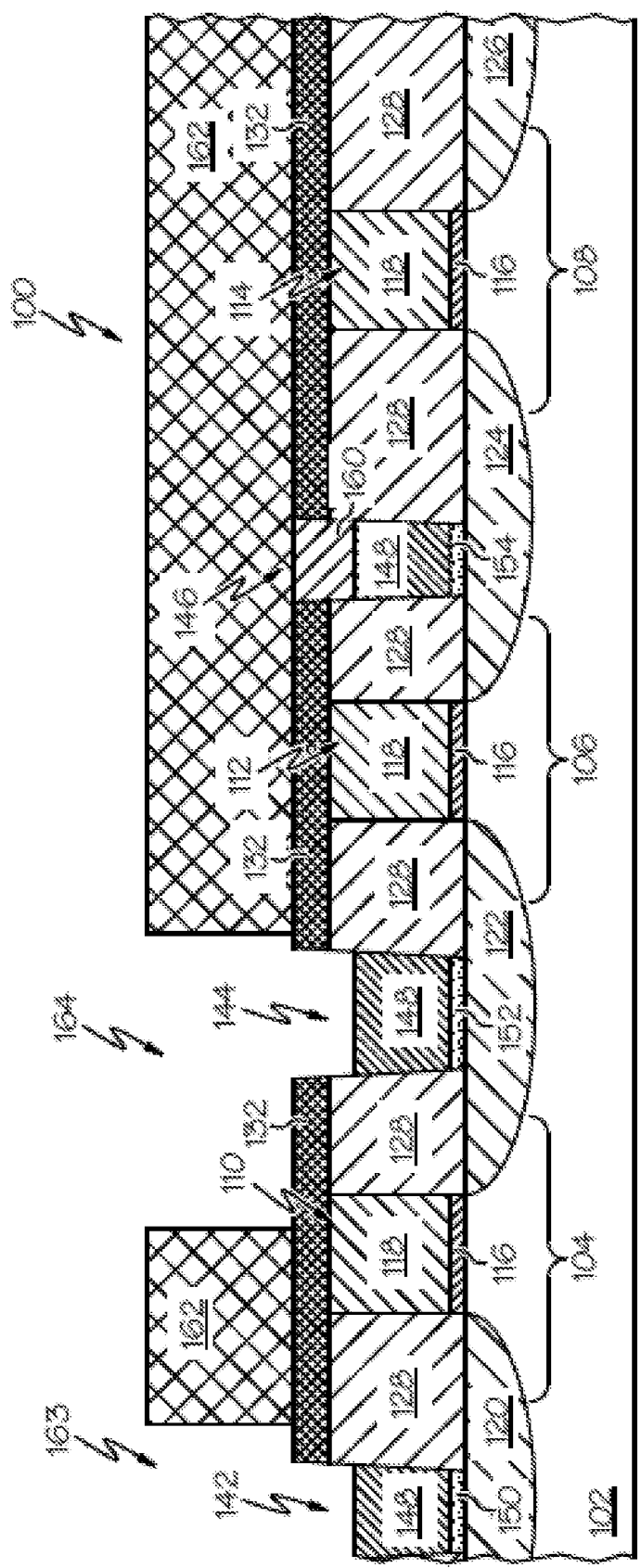
Figure 8:
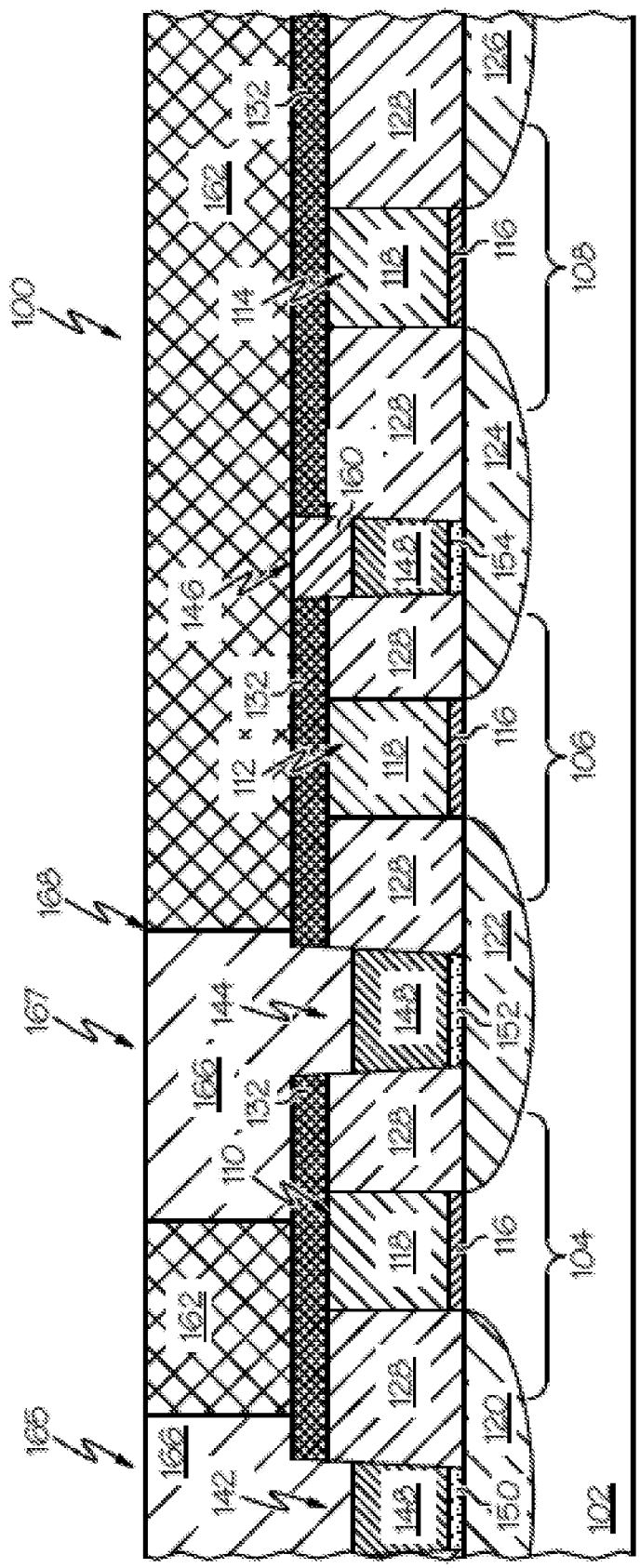

Referring now to FIGS. 6-8, after forming the capping material 160, the fabrication process continues by forming a contact layer overlying the semiconductor substrate that includes one or more source/drain contacts 165, 167. The source/drain contacts 165, 167 in the contact layer provide vertical interconnections between the lower level source/drain contacts 142, 144 and a metal interconnect layer (e.g., Metal 1) subsequently formed overlying the substrate. Additionally, the source/drain contacts 165, 167 may provide a lateral intralayer interconnection between lower level source/drain contacts 142, 144 (e.g., on another regions of the semiconductor substrate) and/or subsequently formed gate contacts. For convenience, but without limitation, the source/drain contacts 165, 167 formed in the contact layer may alternatively be referred to herein as upper level source/drain contacts because they are formed in a dielectric layer overlying the dielectric layer(s) that the lower level source/drain contacts 142, 144, 146 are formed in.

Referring to FIG. 6, in an exemplary embodiment, the fabrication of the contact layer begins by conformably depositing a layer of a dielectric material 162, such as an oxide material, overlying the device structure 100 of FIG. 5, resulting in the device structure 100 illustrated by FIG. 6. For convenience, but without limitation, the dielectric material 162 may alternatively be referred to herein as an oxide material. After forming the dielectric material 162, the fabrication process continues by selectively removing portions of the dielectric material 162 to create voided regions 163, 164 in the dielectric material 162 that correspond to the lateral pattern, routing and/or interlayer interconnections to be provided by the upper level source/drain contacts 165, 167. For example, a layer of a masking material (e.g., a photoresist material or the like) may be formed overlying the dielectric material 162, and portions of the masking material may be subsequently removed (e.g., using photolithography or a suitable etchant chemistry) to define the pattern for the upper level source/drain contacts 165, 167. In an exemplary embodiment, the mask exposes at least a portion of the dielectric material 162 overlying one or more of the lower level source/drain contacts 142, 144 such that at least a portion of the subsequently formed voided regions 163, 164 overlies or overlaps a lower level source/drain contacts 142, 144 to provide a conduit for the conductive material 166 of the upper level source/drain contacts 165, 167 to contact the lower level source/drain contacts 142, 144.

Referring to FIG. 7, after patterning the masking material to create the etch mask, the exposed portions of the dielectric materials 160, 162 are selectively removed using an anisotropic etchant that removes the exposed portions of the dielectric material 162 until surfaces of the conductive material 148 of the lower level source/drain contacts 142, 144 are exposed. For example, when the dielectric materials 160, 162 are both oxides, exposed portions of dielectric materials 160, 162 may be removed using an anisotropic etch process, such as plasma-based RIE, with an anisotropic etchant chemistry that is selective to oxide material 160, 162 without attacking the hard mask material 132, such that the hard mask material 132 overlying the gate structure 110 remains intact. After exposing the conductive material 148 of the lower level source/drain contacts 142, 144, any remaining masking material is removed in a conventional manner to obtain the semiconductor device structure 100 illustrated in FIG. 7. In the illustrated embodiment, exposed portions of dielectric material 162 overlying the gate structure 110 between lower level source/drain contacts 142, 144 is also removed, such that the voided region 164 overlies or overlaps at least a portion of the gate structure 110. Although FIG. 7 depicts the dielectric material 162 overlying the contact 146 as remaining intact, it should be noted that contacts to contact 146 may be formed within the dielectric material 162 at another location on the semiconductor substrate.

Referring now to FIG. 8, the fabrication of the upper level source/drain contacts 165, 167 within the layer of dielectric material 162 continues by forming a conductive material 166 in the voided regions 163, 164. In an exemplary embodiment, the conductive material 166 is formed by conformably depositing a conductive metal material, such as a tungsten material, overlying the semiconductor substrate 102 to a thickness chosen such that the conductive material 166 fills the voided regions 163, 164 to a minimum height that meets or exceeds the height of the intralayer dielectric material 162. As illustrated in FIG. 8, the conductive material 166 contacts the previously exposed upper surfaces of the lower level source/drain contacts 142, 144 to provide an electrical interconnection to the underlying source/drain regions 120, 122 via the lower level source/drain contacts 142, 144. As illustrated, the hard mask material 132 overlying the gate structure 110 remains intact and isolates the conductive material 166 of the source/drain contact 167 from the gate structure 110. After forming the conductive material 166, the fabrication process continues by planarizing the conductive material 166 to uniformly remove portions of the conductive material 166 across the semiconductor substrate until reaching the dielectric material 162 to obtain a substantially planar surface 168 that is aligned with the upper surface of the dielectric material 162.

Figure 9:
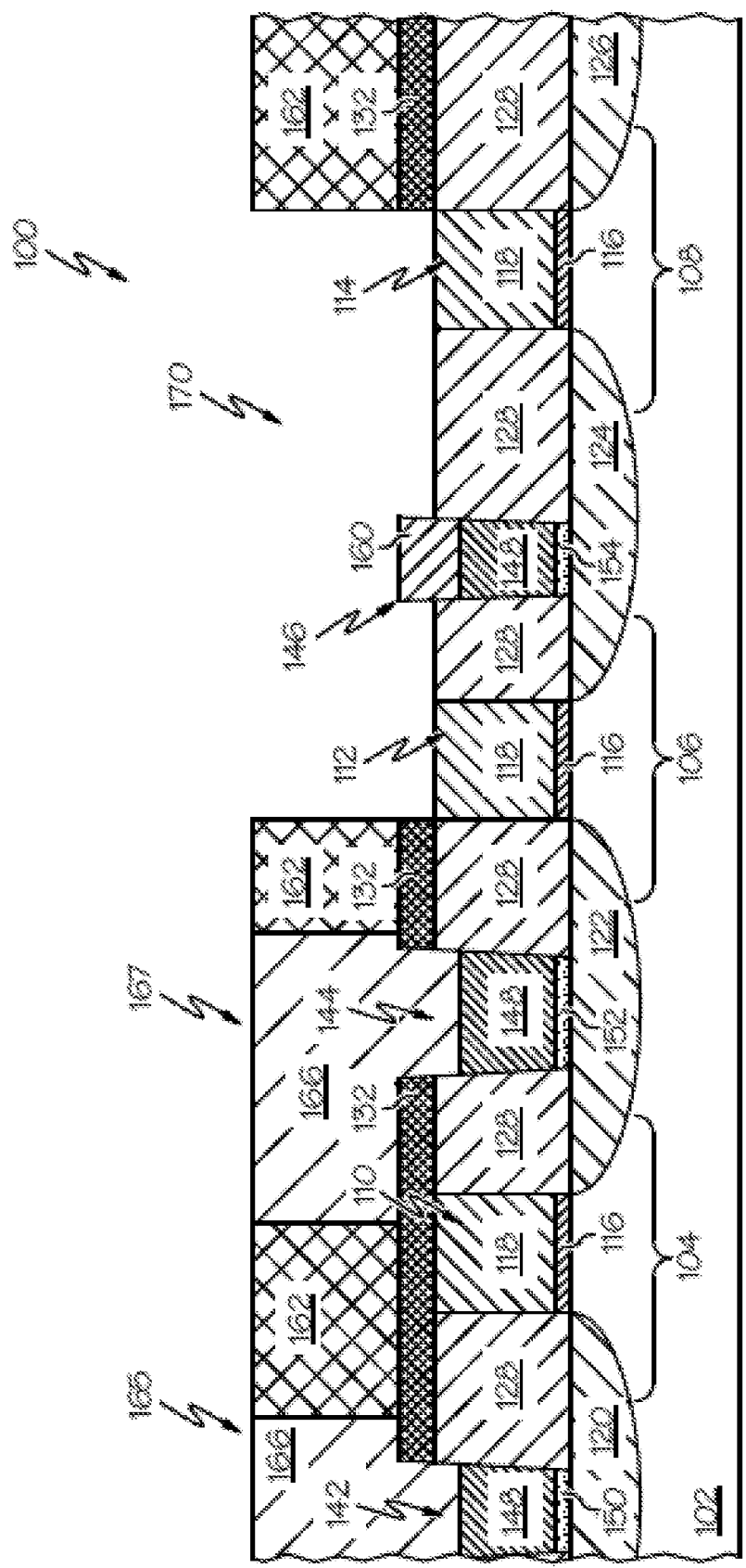
Figure 10:
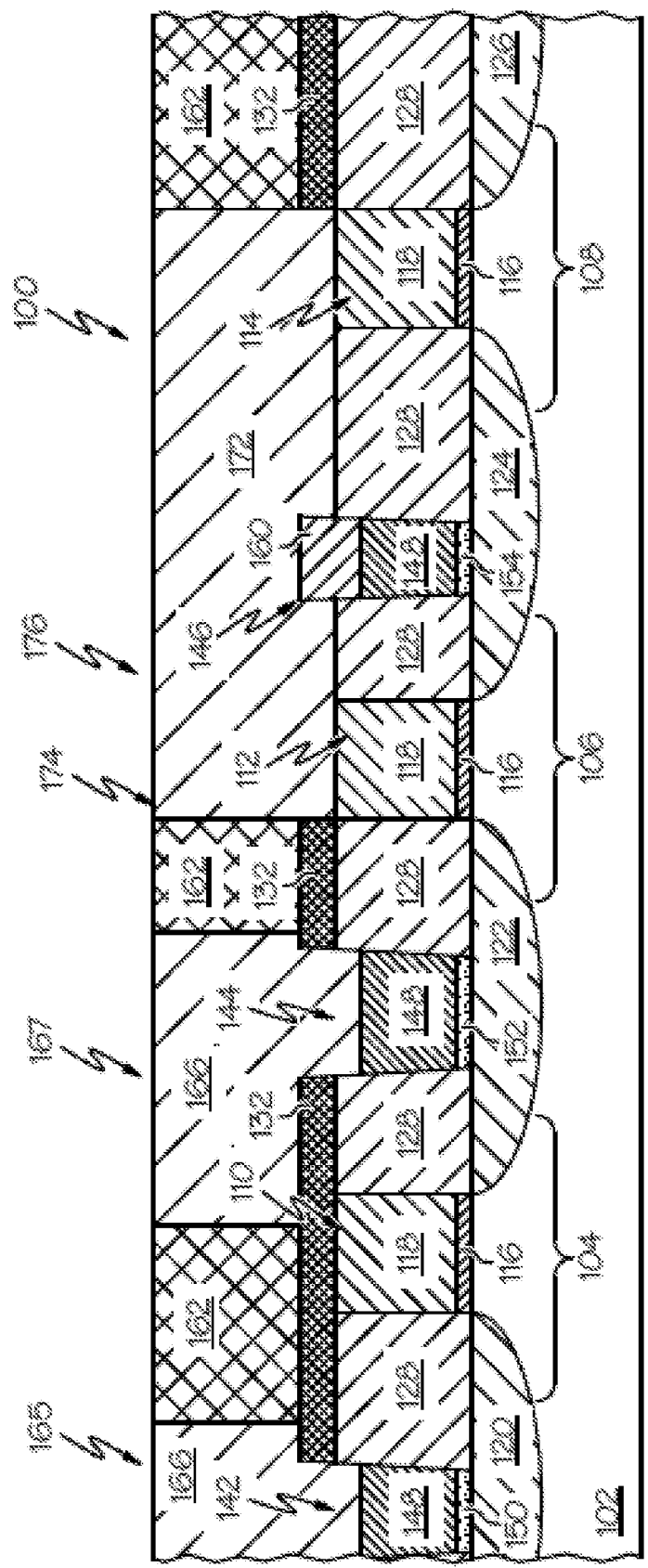

Turning now to FIGS. 9-10, after forming the upper level source/drain contacts 165, 167, the fabrication process continues by forming one or more conductive gate contacts 176 that provide vertical interconnections between one or more of the gate structures 110, 112, 114 and a metal interconnect layer (e.g., Metal 1) subsequently formed overlying the substrate. Additionally, in the illustrated embodiment of FIG. 10, the gate contact 176 also provides lateral interconnections between gate structures 112, 114.

Referring to FIG. 9, after planarizing the conductive material 166, the fabrication process continues by selectively removing portions of the dielectric material 162 to create one or more voided regions 170 in the dielectric material 162 that correspond to the lateral pattern, routing and/or interlayer interconnections to be provided by the gate contacts 176. As described above, a layer of a masking material is formed overlying the dielectric material 162 and portions of the masking material are removed to define the pattern for the gate contacts 176. In an exemplary embodiment, the mask exposes at least a portion of the dielectric material 162 overlying one or more of the gate structures 112, 114 such that at least a portion of the subsequently formed voided region 170 overlies or overlaps the gate structures 112, 114 to provide a conduit for the conductive material 172 of the gate contacts 176 to contact the gate structures 112, 114. In the illustrated embodiment, the dielectric material 162 overlying the lower level source/drain contact 146 between gate structures 112, 114 is also removed, such that the voided region 170 overlies or overlaps the lower level source/drain contact 146 to allow the gate contacts 176 to provide a lateral interconnection spanning across the lower level source/drain contact 146. After patterning the masking material to create the etch mask, the exposed portions of the dielectric material 162 are selectively removed using an anisotropic etchant that removes the exposed portions of the dielectric material 162 until surfaces of the hard mask material 132 are exposed. In this regard, the exposed portions of dielectric material 162 are anisotropically etched using an anisotropic etchant chemistry that is selective to the dielectric material 162 without attacking the hard mask material 132, such that the hard mask material 132 acts as an etch stop. After exposing the hard mask material 132, a second anisotropic etch process is performed to selectively remove the hard mask material 132 using an anisotropic etchant chemistry that is selective to the hard mask material 132 without attacking the capping material 160, resulting in the semiconductor device structure 100 illustrated in FIG. 9. It should be noted that in embodiments where a dielectric gate capping material is formed on the conductive gate material 118, a third anisotropic etch process may be performed to selectively remove the dielectric gate capping material using an anisotropic etchant chemistry that is preferably selective to dielectric gate capping material to expose the conductive gate material 118 while at least a portion of the dielectric capping material 160 remains intact.

Referring now to FIG. 10, the fabrication of the gate contacts 176 continues by forming a conductive material 172 in the voided region 170. In an exemplary embodiment, the conductive material 172 is formed by conformably depositing a conductive metal material, such as a tungsten material, overlying the semiconductor substrate 102 to a thickness chosen such that the conductive material 172 fills the voided region 170 to a minimum height that meets or exceeds the height of the intralayer dielectric material 162. As illustrated in FIG. 10, the conductive material 172 contacts the conductive gate material 118 to provide an electrical interconnection to the gate structures 112, 114. Additionally, in the illustrated embodiment, the conductive material 172 provides lateral interconnections between gate structures 112, 114 by spanning over the lower level source/drain contact 146 while the capping material 160 overlying the contact 146 remains intact and provides a dielectric cap that isolates the conductive material 172 of the gate contact 176 from the conductive material 148 of the contact 146. After forming the conductive material 172, the fabrication process continues by planarizing the conductive material 172 to uniformly remove portions of the conductive material 172 across the semiconductor substrate until reaching the dielectric material 162 to obtain a substantially planar surface 174 that is aligned with the upper surface of the dielectric material 162. After forming the gate contacts, the fabrication process may continue by performing well known back end of line (BEOL) process steps to complete fabrication of the semiconductor device structure 100 in a conventional manner. For example, the fabrication process may proceed by forming an interlayer dielectric material overlying the planar surface 174, forming vias in the interlayer dielectric material, and forming a metal interconnect layer (e.g., Metal 1) overlying the interlayer dielectric material, and repeating these metallization steps until all of the necessary metal interconnect layers have been formed.

It should be noted that although FIGS. 7-10 illustrate the upper level source/drain contacts 165, 167 and the gate contacts 176 as being formed using separate deposition process steps, in practice, the upper level source/drain contacts 165, 167 and the gate contacts 176 may be formed concurrently. For example, after removing exposed portions of the dielectric materials 160, 162 to form voided regions 163, 164, the fabrication process may continue by removing the etch mask used to form voided regions 163, 164, forming an etch mask that exposes portions of the dielectric material 162 overlying gate structures 112, 114, and removing exposed portions of the dielectric material 162 to create the one or more voided regions 170 corresponding to the lateral pattern, routing and/or interlayer interconnections to be provided by the gate contacts 176. After forming the voided regions 163, 164, 170, the upper level source/drain contacts 165, 167 and the gate contacts 176 may then be concurrently formed by conformably depositing a conductive metal material in the voided regions 163, 164, 170 and planarizing the conductive material to obtain a substantially planar surface that is aligned with the upper surface of the dielectric material 162.

FIGS. 11-14 illustrate an alternate embodiment of the fabrication process described above. In the alternate embodiment, prior to forming the layer of hard mask material 132, a dielectric gate capping material 234 is formed on the conductive gate material 118. For example, the capping material 234 may be realized as an oxide material formed by oxidizing the upper surface of the conductive gate material 118 (e.g., by thermal oxidation or chemical oxidation). After creating voided regions overlying the source/drain regions 120, 122, 124, 126 as described above in the context of FIG. 3, lower level source/drain contacts 242, 244, 246 are formed in the voided regions by depositing a conductive material 248, such as a tungsten material, to a thickness chosen such that the conductive material 248 partially fills the voided regions to a maximum height that is less than the height of the dielectric material 128. As illustrated, the upper surfaces of the conductive material 248 formed in the voided regions are below the upper surfaces of the dielectric material 128. After forming the layer of conductive material 248, the conductive material 248 is planarized to remove the conductive material 248 overlying the hard mask material 132, resulting in the semiconductor device structure 200 of FIG. 11.

Figure 11:
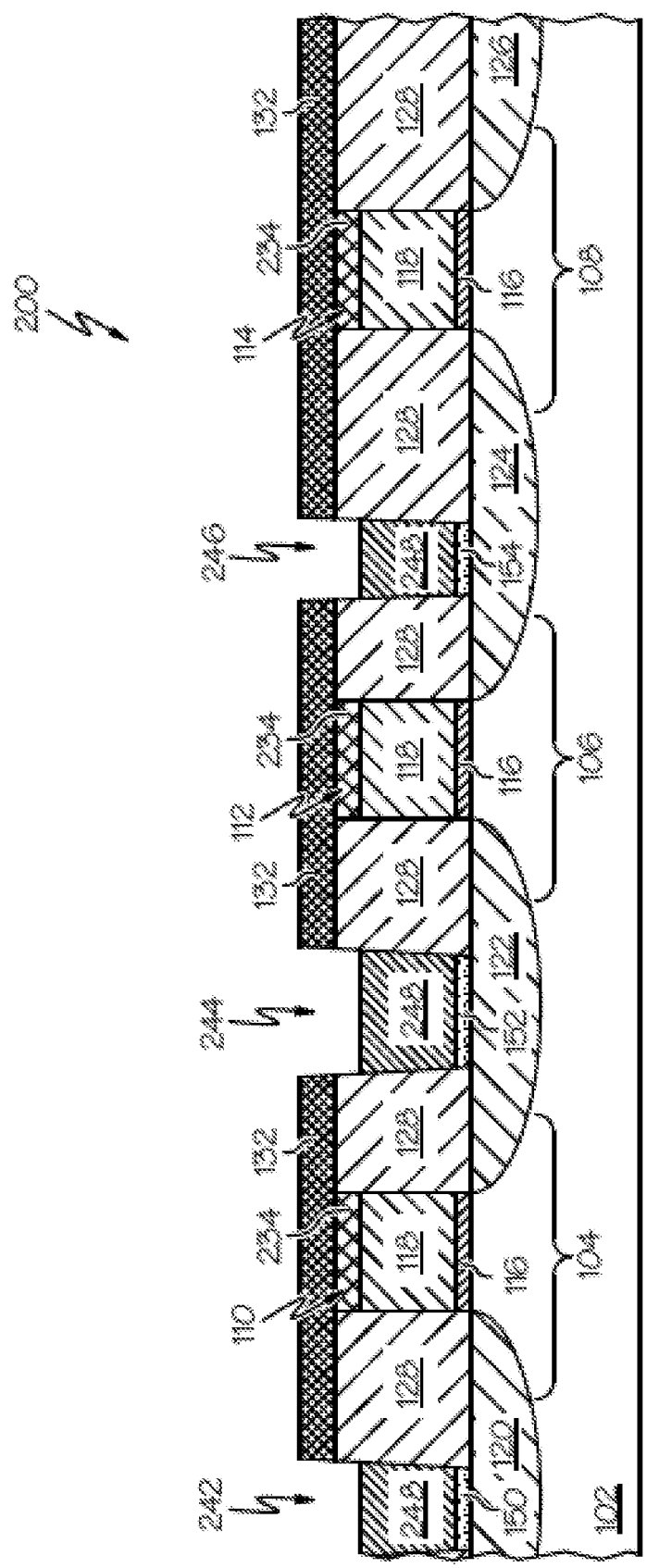
FIGS. 11-14 are cross-sectional views that illustrate another embodiment of a semiconductor device structure and related methods for fabricating the semiconductor device structure.
Figure 12:
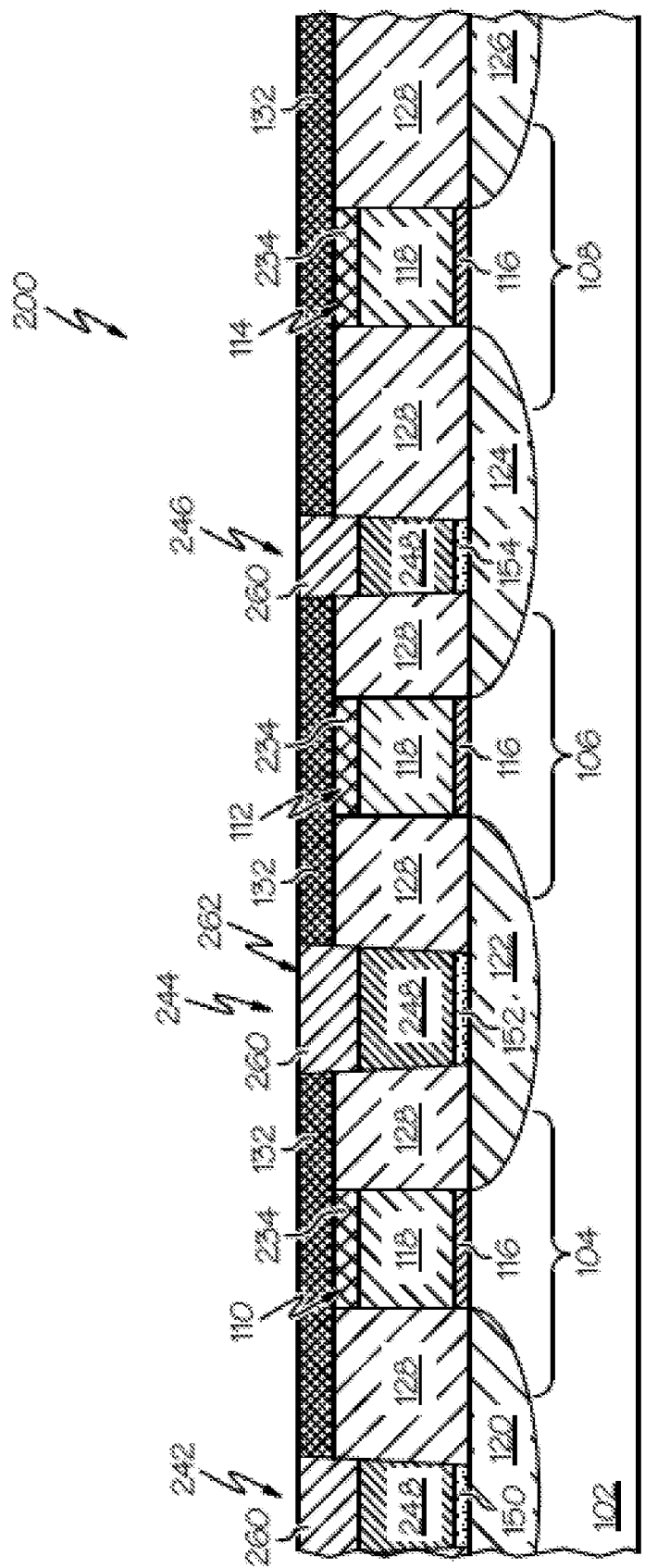

Turning now to FIG. 12, after planarizing the conductive material 248, the alternate fabrication process continues by conformably depositing a dielectric capping material 260, such as a hard mask material or another suitable dielectric material, overlying the semiconductor device structure 200 of FIG. 11. For convenience, the dielectric capping material 260 may alternatively be referred to herein as a hard mask material, however, it will be appreciated that other dielectric capping materials may be utilized in a practical embodiment. In an exemplary embodiment, the layer of the hard mask material 260 is deposited to a thickness that is greater than the difference between the upper surfaces of the hard mask material 132 and the upper surfaces of the conductive material 248. In this manner, the dielectric capping material 260 fills the remainder of the voided regions above the conductive material 248 to a minimum height that meets or exceeds the hard mask material 132 on top of the gate structures 110, 112, 114. After forming the layer of dielectric capping material 260, the dielectric capping material 260 is planarized to obtain a substantially planar surface 262, resulting in the semiconductor device structure 200 of FIG. 12.

Figure 13:
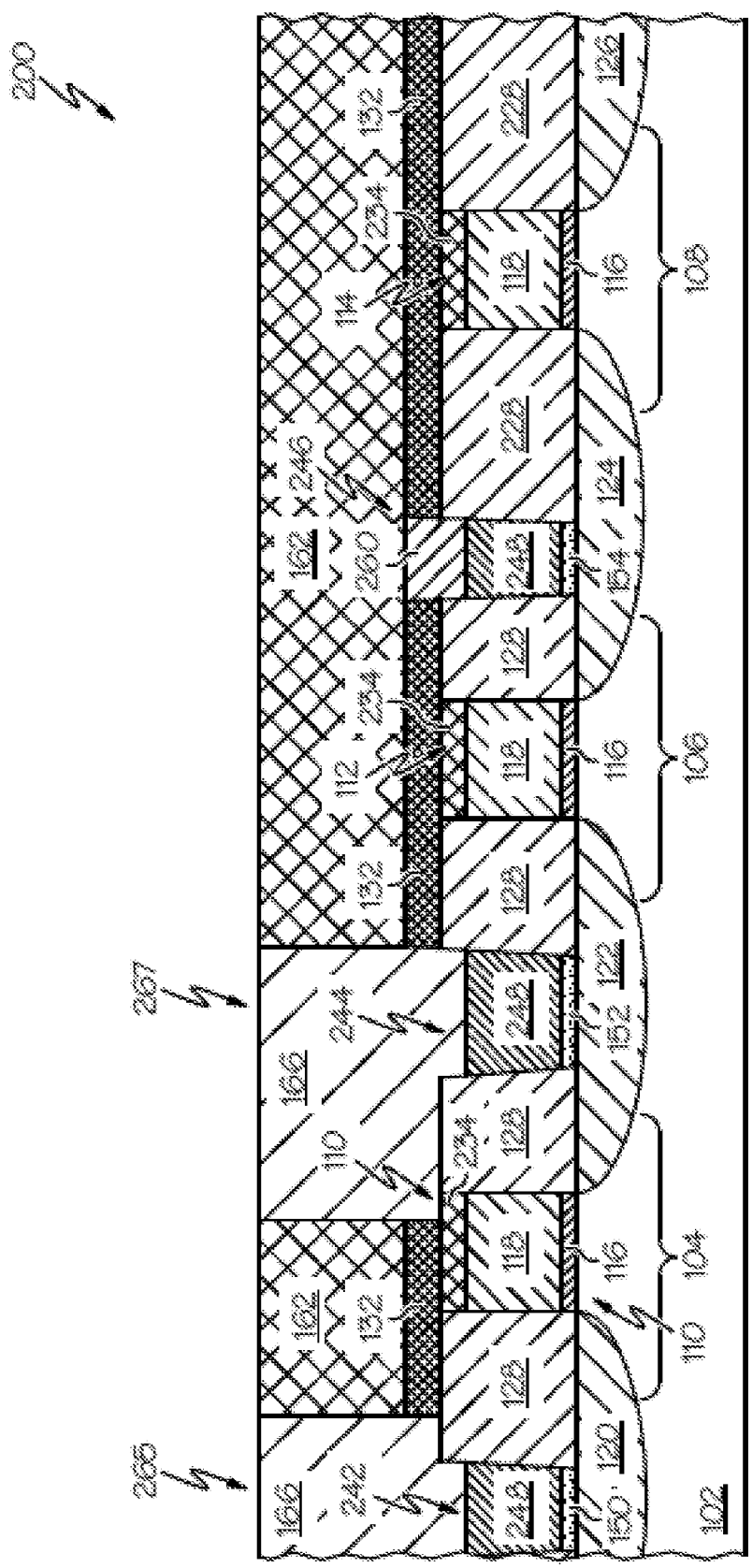

Referring now to FIG. 13, after planarizing the dielectric capping material 260, fabrication of the semiconductor device structure 200 continues by forming upper level source/drain contacts 265, 267 of conductive material 166 in a similar manner as described above in the context of FIGS. 6-8. In this regard, in the alternate embodiment of the fabrication process, when the dielectric capping material 260 and the hard mask material 132 are realized as the same material, such as a nitride material, and the dielectric material 162 is an oxide material, the oxide material 162 may be removed (after forming an etch mask) using an anisotropic etchant chemistry that is selective to the oxide material 162 without attacking the nitride hard mask material 132, 260, such that the hard mask material 260 overlying the lower level source/drain contacts 242, 244 remains intact after etching the overlying dielectric material 162. After exposing the hard mask material 132, 260, a second anisotropic etch process is performed to selectively etch the hard mask material 132, 260 without attacking the dielectric gate capping material 234, such that at least a portion of the dielectric gate capping material 234 remains intact and isolates the conductive gate material 118 from the conductive material 166 of the subsequently formed source/drain contact 267. After the conductive material 248 of the lower level source/drain contacts 242, 244 is exposed, the upper level source/drain contacts 265, 267 are formed by depositing and planarizing the conductive material 166 in a similar manner as described above in the context of FIG. 8.

Figure 14:
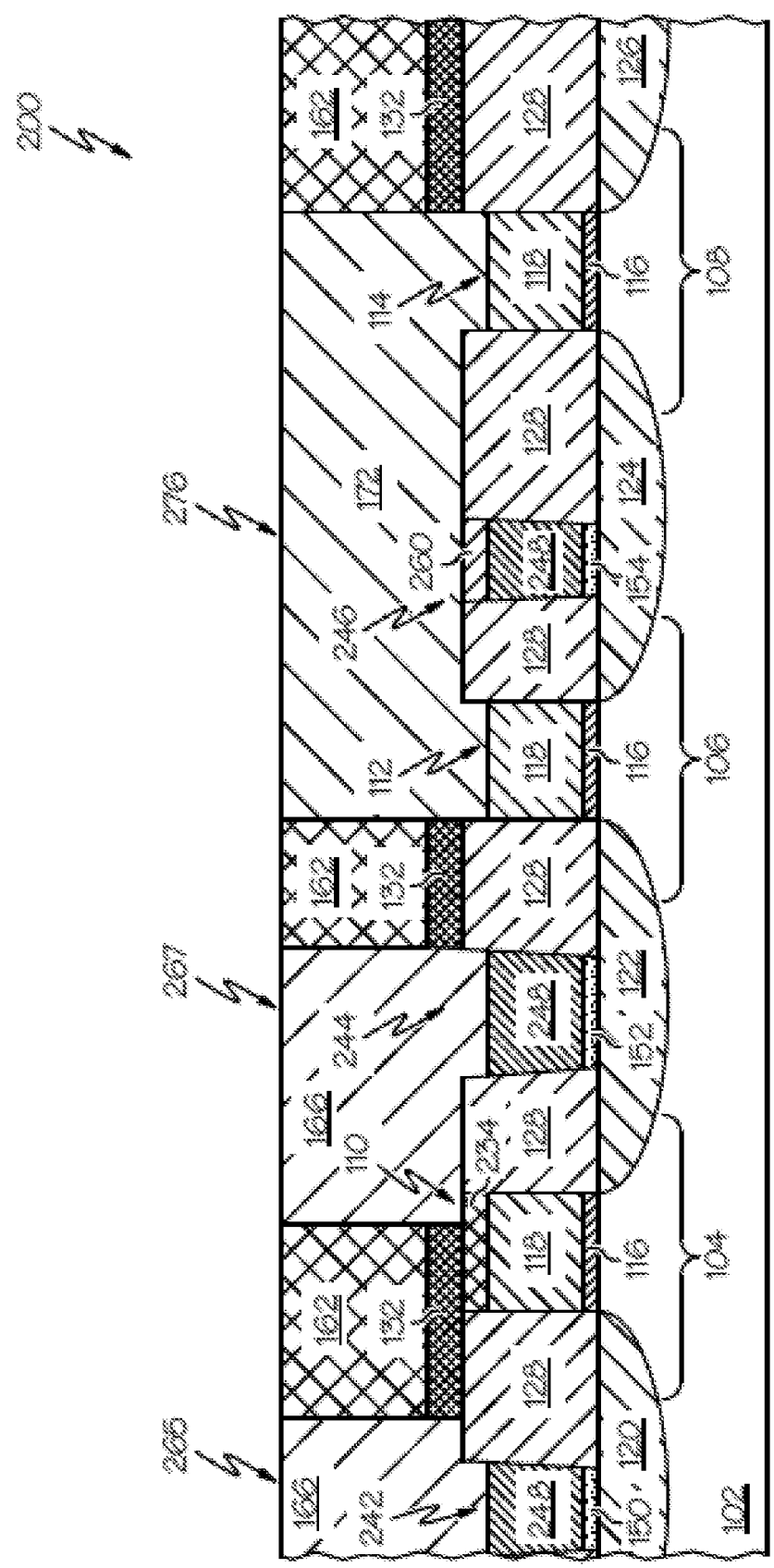

Referring now to FIG. 14, after planarizing the conductive material 166, fabrication of the semiconductor device structure 200 continues by forming gate contacts of conductive material 172 in a similar manner as described above in the context of FIGS. 9-10. In the alternate embodiment of the fabrication process, after forming the etch mask defining the lateral pattern, routing and/or interlayer interconnections to be provided by the gate contacts, the dielectric material 162 is anisotropically etched to expose the underlying hard mask material 132, 260 using an anisotropic etchant that is selective to the dielectric material 162 without attacking the hard mask material 132, 260, such that the hard mask material 132, 260 acts as an etch stop. After exposing the hard mask material 132, 260, a second anisotropic etch process is performed to selectively remove the hard mask material 132, 260 using an anisotropic etchant chemistry that is selective to the hard mask material 132, 260 without attacking the dielectric gate capping material 234. In this regard, by virtue of the upper surfaces of the conductive material 248 being below the upper surfaces of the gate structures 110, 112, 114, at least a portion of the hard mask material 260 overlying the lower level source/drain contact 246 remains intact after the hard mask material 132 is removed from the gate structures 112, 114. After removing the exposed hard mask material 132 from the gate structures 112, 114, a third anisotropic etch process is performed to selectively remove the gate capping material 234 and expose the conductive gate material 118 using an anisotropic etchant chemistry that is selective to the gate capping material 234 without attacking the remaining hard mask material 260 overlying the lower level source/drain contact 246. After the conductive gate material 118 is exposed, the gate contact 276 is formed by conformably depositing and planarizing the conductive material 172 in a similar manner as described above in the context of FIG. 10. As illustrated in FIG. 14, the remaining hard mask material 260 on the lower level source/drain contact 246 remains intact as a dielectric cap that isolates the conductive material 248 of the lower level source/drain contact 246 from the conductive material 172 of the gate contact 276 when the conductive material 172 spans across the lower level source/drain contact 246 to provide lateral interconnections between gate structures 112, 114.

Figure 15:
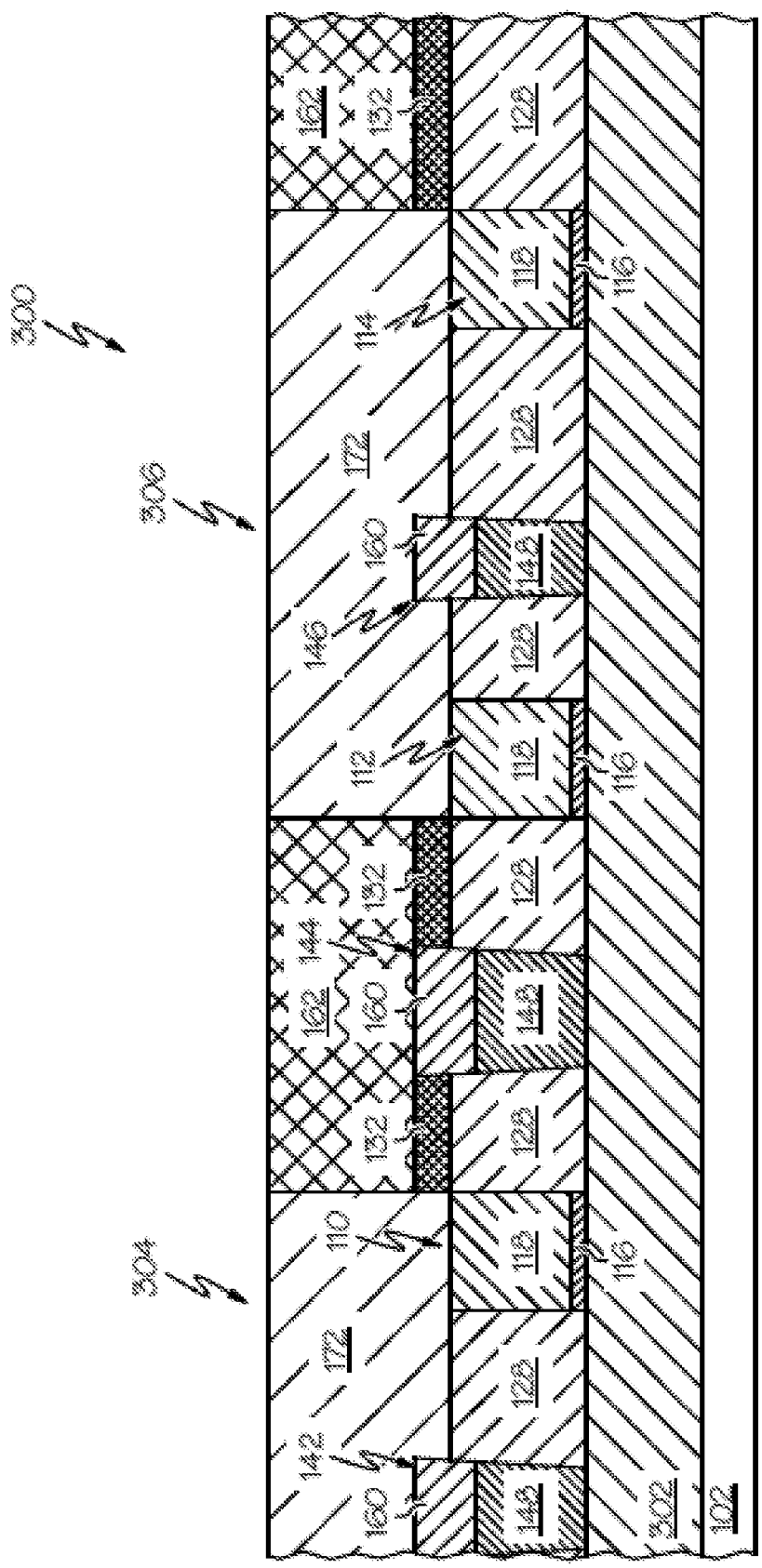
FIG. 15 is a cross-sectional view that illustrates another exemplary embodiment of a semiconductor device structure.

FIG. 15 illustrates a cross-sectional view of another embodiment of a semiconductor device structure 300 that may be fabricated in accordance with the processes described herein. The illustrated semiconductor device structure 300 includes an isolation region 302, such as an oxide material or another dielectric material, formed in the semiconductor substrate material 102 in a conventional manner (e.g., STI or another isolation process) to isolate doped regions (or diffusion regions) of the semiconductor material 102 having transistor structures formed thereon. In the illustrated embodiment, the lower level source/drain contacts 142, 144, 146 extend laterally across the isolation region 302 to provide lateral intralayer interconnections between source/drain regions of transistor structures formed on diffusion regions isolated by the isolation region 302. In the illustrated embodiment, gate contacts 304, 306 are formed in the dielectric material 162 overlying the isolation region 302 to provide vertical interconnections between the gate structures 110, 112, 114 and a metal interconnect layer (e.g., Metal 1) subsequently formed overlying the substrate, with gate contact 306 also providing a lateral interconnection between gate structures 112, 114. As illustrated, the dielectric capping material 160 on the lower level source/drain contacts 142, 144, 146 overlying the isolation region 302 isolates the lower level source/drain contacts 142, 144, 146 from the gate contacts 304, 306, thereby allowing the lower level source/drain contacts 142, 144, 146 to provide intralayer interconnections between the source/drain regions of different transistor structures formed on different diffusion regions with a reduced risk of inadvertent electrical connections (or shorts) being created between the gate contacts 304, 306 and the lower level source/drain contacts 142, 144, 146. For the embodiment illustrated in FIG. 15, upper level source/drain contacts between the lower level source/drain contacts 142, 144, 146 and an overlying metal interconnect layer (e.g., Metal 1) may be formed overlying the diffusion regions as described above in the context of FIGS. 1-14.

To briefly summarize, one advantage of the fabrication processes described herein is that dielectric caps are formed on the lower level source/drain contacts, thereby preventing inadvertent electrical connections between lower level source/drain contacts and neighboring gate contacts as device geometries are reduced. As a result, the lower level source/drain contacts may be utilized to provide intralayer interconnections between the source/drain regions of different transistor structures with a reduced risk of inadvertent electrical connections (or shorts) being created between adjacent and/or overlying gate contacts and the lower level source/drain contacts.

While at least one exemplary embodiment has been presented in the foregoing detailed description, it should be appreciated that a vast number of variations exist. For example, although the subject matter may be described herein in the context of conformal deposition and anisotropic etch processes, practical embodiments of the fabrication processes described herein may utilize other types of deposition and etch processes (e.g., a non-conformal deposition in lieu of a conformal deposition or an isotropic etchant in lieu of an anisotropic etchant). In this regard, it will be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device structure comprising:
   a substrate of a semiconductor material;
   a gate structure overlying the substrate;
   a doped region formed in the substrate proximate the gate structure;
   a conductive contact electrically connected to the doped region; and
   a dielectric contact cap overlying the conductive contact, the dielectric contact cap being in contact with edges of a dielectric material.

2. The semiconductor device structure of claim 1, further comprising:
   a first dielectric material overlying the doped region, wherein the conductive contact is formed in the first dielectric material and wherein the dielectric contact cap is in contact with edges of the first dielectric material; and
   a doped region contact formed in a second dielectric material overlying the first dielectric material, the doped region contact being electrically connected to the gate structure, wherein the dielectric contact cap is disposed between the conductive contact and the doped region contact.

3. The semiconductor device structure of claim 1 further comprising:
   a first dielectric material overlying the doped region, wherein the conductive contact is formed in the first dielectric material; and
   a third dielectric material overlying the first dielectric material, wherein the conductive contact is formed in the third dielectric material such that the conductive contact is bounded and contacted by edges of the first dielectric material and by edges of the third dielectric material.

4. The semiconductor device structure of claim 3 wherein the dielectric contact cap is formed within the third dielectric material and is in contact with the edges of the third dielectric material.

5. The semiconductor device structure of claim 4 further comprising:
   a second dielectric material overlying the gate structure and the dielectric contact cap; and
   a doped region contact within the second layer, the doped region contact being electrically connected to the gate structure.

6. The semiconductor device structure of claim 4 wherein at least a portion of the doped region contact is overlying the dielectric contact cap.

7. A semiconductor device structure comprising:
   gate structures overlying a semiconductor substrate and doped regions formed in the semiconductor substrates;
   a first layer of a first dielectric material overlying the semiconductor substrate;
   a dielectric gate cap overlying a non-selected gate structure;
   conductive contacts formed within the first layer, wherein each conductive contact is electrically connected to a selected doped region;
   a second layer of a second dielectric material overlying the first layer and the dielectric gate cap;
   a doped region contact formed in the second dielectric material and directly overlying the non-selected gate structure, the doped region contact being electrically connected to a selected conductive contact and insulated from the non-selected gate structure by the dielectric gate cap.

8. The semiconductor device structure of claim 7 wherein the doped region contact is formed on the dielectric gate cap.

9. The semiconductor device structure of claim 8 wherein the doped region contact is formed on the first layer of the first dielectric material.

10. The semiconductor device structure of claim 7 wherein the dielectric gate cap is formed on the non-selected gate structure.

11. The semiconductor device structure of claim 7 further comprising:
    a dielectric contact cap on a non-selected conductive contact; and
    a first gate contact within the second layer, wherein the gate contact is electrically connected to a selected gate structure and insulated from the non-selected conductive contact by the dielectric contact cap, and wherein the dielectric gate cap is bounded by edges of the first layer.

12. The semiconductor device structure of claim 11 wherein the first gate contact is overlying the non-selected conductive contact.

13. The semiconductor device structure of claim 7 wherein the doped region contact has a bottom surface, and wherein a portion of the bottom surface is overlying the non-selected gate structure.

14. The semiconductor device structure of claim 7 wherein the doped region contact has a bottom surface, and wherein a portion of the bottom surface is in contact with the dielectric gate cap.

15. The semiconductor device structure of claim 7 wherein the non-selected gate structure has a top surface, and wherein the top surface is in contact with the dielectric gate cap.

16. A semiconductor device structure comprising:
    gate structures overlying a semiconductor substrate and doped regions formed in the semiconductor substrate;
    a first layer of a first dielectric material overlying the semiconductor substrate;
    a dielectric gate cap overlying a non-selected gate structure, wherein the dielectric gate cap is bounded by edges of the first layer;
    conductive contacts formed within the first layer, wherein each conductive contact is electrically connected to a selected doped region;
    a dielectric contact cap on a non-selected conductive contact;
    a second layer of a second dielectric material overlying the first layer; and
    a first gate contact within the second layer, wherein the gate contact is electrically connected to a selected gate structure and insulated from the non-selected conductive contact by the dielectric contact cap.

17. The semiconductor device structure of claim 16 further comprising a doped region contact within the second layer, wherein the doped region contact is electrically connected to a selected conductive contact and insulated from the non-selected gate structure by the dielectric gate cap.

18. The semiconductor device structure of claim 17 further comprising a third layer of a third dielectric material overlying the first layer and the dielectric gate cap, wherein the dielectric contact cap is bounded by edges of the third layer.

19. The semiconductor device structure of claim 17 wherein the doped region contact is formed on the dielectric gate cap.

20. The semiconductor device structure of claim 17 wherein the doped region contact has a bottom surface, and wherein a portion of the bottom surface is overlying the non-selected gate structure.

* * * * *